United States Patent
Bishop et al.

(10) Patent No.: US 6,400,009 B1
(45) Date of Patent: Jun. 4, 2002

(54) HERMATIC FIREWALL FOR MEMS PACKAGING IN FLIP-CHIP BONDED GEOMETRY

(75) Inventors: David John Bishop, Summit; John VanAtta Gates, II, New Providence; Jungsang Kim, Basking Ridge, all of NJ (US)

(73) Assignees: Lucent Technologies Inc., Murray Hill, NJ (US); Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/419,488

(22) Filed: Oct. 15, 1999

(51) Int. Cl.[7] .............................................. H01L 23/12
(52) U.S. Cl. ..................... 257/704; 257/710; 257/659
(58) Field of Search .............................. 257/704, 710, 257/659, 660, 729, 712, 703, 708

(56) References Cited

U.S. PATENT DOCUMENTS

| | | |
|---|---|---|
| 3,591,839 A | 7/1971 | Evans |
| 5,291,572 A | 3/1994 | Blonder et al. |
| 5,323,051 A | 6/1994 | Adams et al. |
| 5,667,132 A | 9/1997 | Chirovsky et al. |
| 5,668,033 A | 9/1997 | Ohara et al. |
| 5,939,772 A * | 8/1999 | Hurst et al. ................ 257/659 |
| 5,942,796 A * | 8/1999 | Mosser et al. .............. 257/712 |
| 6,140,698 A * | 10/2000 | Damphousse et al. ...... 257/704 |

FOREIGN PATENT DOCUMENTS

DE            32 08 604 A1     9/1983

* cited by examiner

*Primary Examiner*—Elvin Enad
*Assistant Examiner*—Kyung S. Lee
(74) *Attorney, Agent, or Firm*—Cohen, Pontani, Lieberman & Pavane

(57) ABSTRACT

A package for hermetically sealing a microelectromechanical systems (MEMS) device in a hybrid circuit comprise a firewall formed on a substrate for the MEMS device and which has a height defining a cavity of the package in which the MEMS device will be sealed. A second substrate spaced from the first substrate hermetically seals the cavity when the second substrate is flip-chip bonded to the first substrate and soldered to the first substrate with a thin film metal material placed on at least a top portion of the firewall. The resulting firewall MEMS device package can be further packaged using conventional CMOS packaging techniques. By hermetically sealing the cavity, the enclosed MEMS device is protected from deleterious conditions found in the environment of conventional CMOS packaging techniques which is often detrimental to MEMS device function.

18 Claims, 4 Drawing Sheets

HERMATIC FIREWALL FOR MEMS PACKAGING IN FLIP-CHIP BONDED GEOMETRY

BACKGROUND OF THE INVENTION

1. Field of the Invention

The present invention relates to packaging for microelectromechanical systems (MEMS) devices. More specifically, the present invention relates to packaging of MEMS devices in flip-chip bonded geometry to provide hermetic seals for the MEMS devices.

2. Description of the Related Art

MEMS devices have become ubiquitous in the semiconductor industry and are used in hybrid electrical and mechanical functions that are necessary in many electronic and electro-optical systems. Packaging MEMS devices in such systems is in general a costly process. Because mechanical motion is an essential part of the MEMS function, a carefully designed space for the motion is needed in order for the MEMS device to operate reliably. Conventional packaging techniques used for CMOS electronics are performed after the CMOS devices are appropriately protected using proper passivation material. Such passivation procedure protects the devices from the packaging processes that are usually mechanically and chemically harsh. After device passivation, packaging is performed by injecting either molten plastic or epoxy over the CMOS chip. Since the CMOS function relies purely on the electronic properties of silicon, such a packaging process does not interfere with device performance. However, these packaging techniques usually involve treatment of semiconductor chips using a fluid, and are therefore not compatible with MEMS device operation. For this reason, expensive ceramic packaging has usually been chosen over cost-effective plastic molded packages for MEMS devices.

Most MEMS devices need to operate in a controlled environment to achieve optimum device performance and reliability. Some examples of controlled environments include controlled pressure (vacuum), controlled humidity, and controlled chemical (typically a special gas) environments. Packaging MEMS devices cost-effectively under these conditions is desired in the art, but due to the complexities and sensitivities associated with operation environments of MEMS devices it is often a difficult or impractical task.

It is also essential that such cost-effective MEMS packaging technology be compatible with CMOS packaging technology. This is important because CMOS technology is already mature and commercially available. Moreover, the need to integrate MEMS devices with CMOS technology is becoming increasingly important in order to add functionality to the CMOS chip that simple CMOS devices cannot provide, and to provide control of MEMS devices using CMOS integrated circuits. Most CMOS packaging techniques wherein wet chemistry and high-pressure fluid flows are used, however, are detrimental to MEMS devices. Thus, current CMOS packaging techniques will not adequately protect the MEMS devices during the packaging process.

Accordingly, there is a long-felt, but unresolved need in the art for MEMS packaging techniques which hermetically seal the MEMS devices so that they can effectively be incorporated in CMOS and other hybrid circuits. The packages should be cost-effective and ensure that electrical connections to or with the MEMS devices can be achieved without breaching the integrity of the package. Moreover, such packages should be easily integratable with current semiconductor fabrication processes and be compatible with conventional CMOS packaging methods.

SUMMARY OF THE INVENTION

The present invention provides a novel packaging technique that enables conventional CMOS packaging procedures be used to package MEMS devices. It also provides means to control the operation environment of the MEMS devices at the same time. The inventive packages produce a protected cavity around the MEMS devices which is created by a a flip-chip bonding process. In a preferred embodiment, a firewall is fabricated on a first substrate around the MEMS device to enclose the MEMS device within the cavity bounded by the firewall. Another substrate is then flip-chip bonded to the first substrate that holds the MEMS device. This second substrate may hold other MEMS devices to complete the structure or functionality of the overall hybrid circuit, may hold CMOS electronics to control the MEMS device(s) on the first and/or second substrate, or may serve purely as a mechanical "cover" of the MEMS device firewall. A gap between the two substrates is accurately controlled by the height of the firewall itself, by spacers of known height, or with spacers in conjunction with the height of the firewall. The spacers can be fabricated independently on the substrate, in which case they will not form a portion of the firewall per se. In a preferred embodiment, the cavity is hermetic, which means that the cavity is sealed against the environment of the package to protect the MEMS device from any deleterious conditions found or present in the environment of the package.

Upon flip-chip bonding of the two substrates, the firewall seals off the space immediately around the MEMS device(s). At the same time, mechanical support and integrity is provided for the package by the bonded substrates through appropriate bonding techniques. In still a further preferred embodiment, the hermetic firewall itself provides the mechanical support for the package. Still more preferably, independent structures are provided to the package to give the package its additional mechanical support. Once the cavity has been created by the firewall and the MEMS device is protected accordingly, the hybrid chip containing the MEMS device in its package can be further packaged using conventional CMOS packaging technology.

The inventive packages for MEMS devices are simple to implement and can easily be performed with conventional CMOS packaging technology. Moreover, packages provided in accordance with the present invention may hermetically seal MEMS devices from deleterious effects found in a packaging environment which could damage the MEMS devices. Thus, the packages disclosed and claimed herein efficiently protect MEMS devices so that these devices can function robustly when in use.

These and other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings, wherein like reference numerals identify similar elements throughout the several views.

DETAILED DESCRIPTION OF THE PRESENTLY PREFERRED EMBODIMENTS

Figure 1:
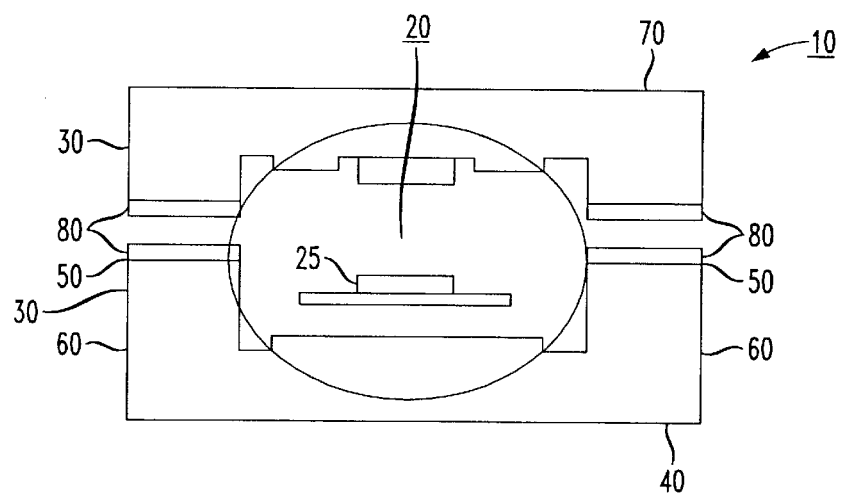
FIG. 1 is a schematic, cross-sectional view of a hermetic firewall package for enclosing MEMS devices in accordance with the present invention.

Referring now to the drawings, FIG. 1 depicts a schematic cross-sectional view of the hermetic firewall structure of the present invention identified by the general reference numeral 10. The package 10 comprises a cavity 20 for enclosing a MEMS device 25 or several MEMS devices, depending on the particular hybrid circuit application in which the MEMS device(s) will be integrated. In a preferred embodiment, a firewall 30 is fabricated on one or both substrates 40 and 70 on one of which the MEMS device is fabricated. The firewall 30 includes a top surface 50 and a bottom surface 60. The package 10 further comprises a second substrate 70 which is bonded to the first substrate through the firewall 30 formed on substrate 40. The second substrate 70 contains a mating seal to the firewall 30, which completes the firewall structure. Preferably, the second substrate is "flip-chip" bonded to substrate 40, using a suitable bonding technique. A preferred bonding technique is a heat-based process wherein a material such as a metal or plastic resin is placed between two parts to be welded together and heated to melt or soften the material. When the material thereafter hardens, a strong, resilient seal is created between the two pieces. Substrates 40, 70 are conventional substrates used to fabricate CMOS electronic devices. Such substrates usually comprise silicon, although it will be recognized by those skilled in the art that the substrates may, for example, comprise GaAs, Ge or other semiconductor materials, or insulating materials such as quartz, alumina, or sapphire. For ease of description hereinbelow but without intending to limit the invention, it will be assumed that the substrates are silicon substrates.

The firewall 30 is fabricated around the MEMS device 25, and may be fabricated on either of the substrates 40, 70. The height of the firewall 30 can be precisely controlled to thereby control the spacing between the two substrates. For some MEMS devices, the spacing may be an integral part of the MEMS device function, while in others it has to be simply large enough to accommodate the MEMS devices in the cavity 20. A sealing material is employed atop the firewall 30 to produce a hermetic seal 80 for the cavity 20. The sealing material is preferably a thin film metal material and is placed on at least a portion of the top 50 of firewall 30 to seal the cavity 20 when the second substrate 70 is flip-chip bonded to first substrate 40. During the flip-chip bonding process, the welding materials on both sides of the substrates are heated and pressed together, resulting in a tight hermetic seal between the flip-chip bonded substrates 40, 70. After the flip-chip bonding process, cavity 20 is bounded and formed by the firewall 30 and substrates 40, 70 and encloses a small space around the MEMS device 25. This leaves the MEMS device 25 intact and protected from subsequent packaging processes performed outside cavity 20, which might involve fluid treatment that have deleterious effects on the MEMS device 25.

The hermetic firewalls of the present invention can be fabricated using the same process that is employed for fabricating MEMS devices. In an example of MEMS devices fabricated using silicon surface micromachining technology, the firewalls may be made up of alternating stacks of polycrystalline silicon and silicon dioxide, encapsulated by polycrystalline silicon. Another alternative is to use a material that is deposited or spin-coated and patterned on a substrate using a lithography technique. Some examples include silicon nitride, polyimide and metal. In all cases, the material comprising the firewall 30 must have the desired chemical and mechanical strength to create a hermetic seal between the substrates and the firewall and to protect the MEMS device 25. Using such techniques, the height of the walls can be defined precisely.

Figure 2:
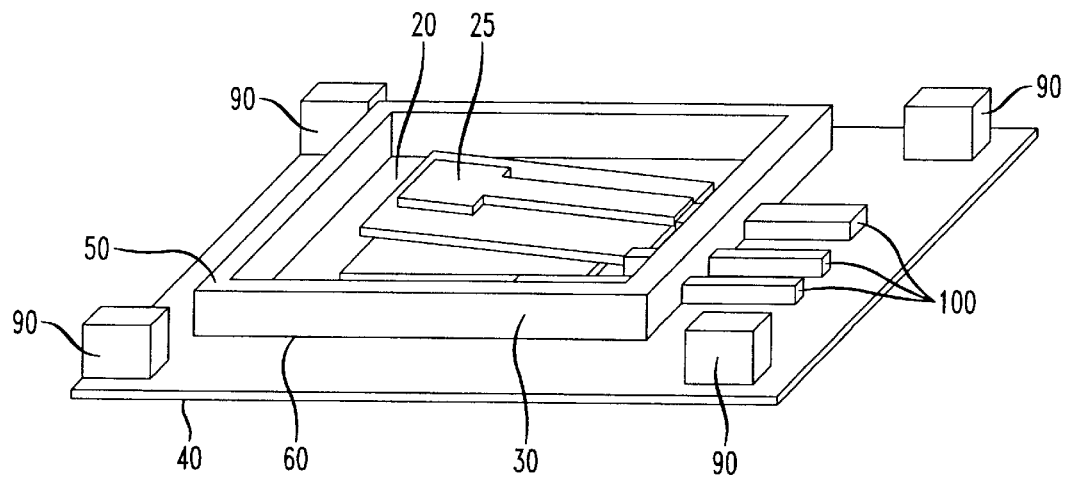
FIG. 2 is an elevated perspective view of a hermetic firewall MEMS package wherein the firewall serves as a spacer while mechanical support is provided by solder bumps outside of the firewall.

In a preferred embodiment depicted in FIG. 2, a hermetic seal 80 between the firewalls on first and second substrates can be formed by evaporating a soft metal such as gold, silver, or their alloys onto the top of firewall 30, and pressing down on the metal surface in a heated environment. The heated environment may be created during the flip-chip bonding process of the first substrate to the second substrate itself, or by an independent heating or soldering process known to those skilled in the art. However, creating such a seal 80 usually does not provide enough mechanical strength to hold the substrates together and to provide mechanical integrity to the package 10. A stronger mechanical seal may be achieved using stronger solder, which is used in conventional flip-chip bonded packaging techniques. When it is desired to use additional solder to provide a stronger mechanical support, a plurality of solder bumps 90 can be bonded to the first substrate 40 which will provide mechanical support and integrity to the package, when the second substrate (not shown in FIG. 2) is flip-chip bonded to the first substrate. Alternately, the solder bumps 90 may be bonded to the second substrate which is simply a matter of design choice.

Of critical importance in the fabrication of packages for MEMS devices in accordance with the present invention is that the electrical connection to the MEMS device 25 with the rest of the circuit must traverse firewall 30 without breaching the hermetic seal enclosing the cavity 20. In a preferred embodiment, electrical leads 100 connecting the MEMS device 25 to the rest of the circuit are inserted through firewall 30 during the MEMS fabrication process. In this case, for example, the leads can be made up of heavily doped conductive polycrystalline silicon, encapsulated by silicon dioxide layers to achieve electrical isolation. In another preferred embodiment, the electrical leads 100 can be placed underneath the firewall. Alternatively, leads 100 may be secured to the second substrate 70 that contains CMOS circuitry, for example, thereby alleviating the need to breach or otherwise corrupt the firewall 30 by requiring the leads 100 to physically traverse therethrough. In this case, vertical electrical connection between the MEMS device 25 on substrate 40 and the electrical leads on substrate 70 has to be fabricated. Such connection can easily be achieved by means of solder bumps or metallizing independent spacers 120 (FIG. 3).

In the embodiment of FIG. 2, the firewall 30 comprises stacks of poly-silicon and silicon dioxide layers. The firewall 30 itself also serves as a spacer for cavity 20 to control the gap between the two substrates 40 and 70 so that cavity 20 has a height defined by the height of firewall 30. Mechanical strength is provided by independent solder bumps 90 placed outside the firewall 30. The solder bumps 90 may be placed at any convenient location on either or both of substrates 40, 70. The electrical leads 100 preferably comprise poly-silicon surrounded by silicon dioxide layers, encapsulated by another layer of poly-silicon.

Figure 3:
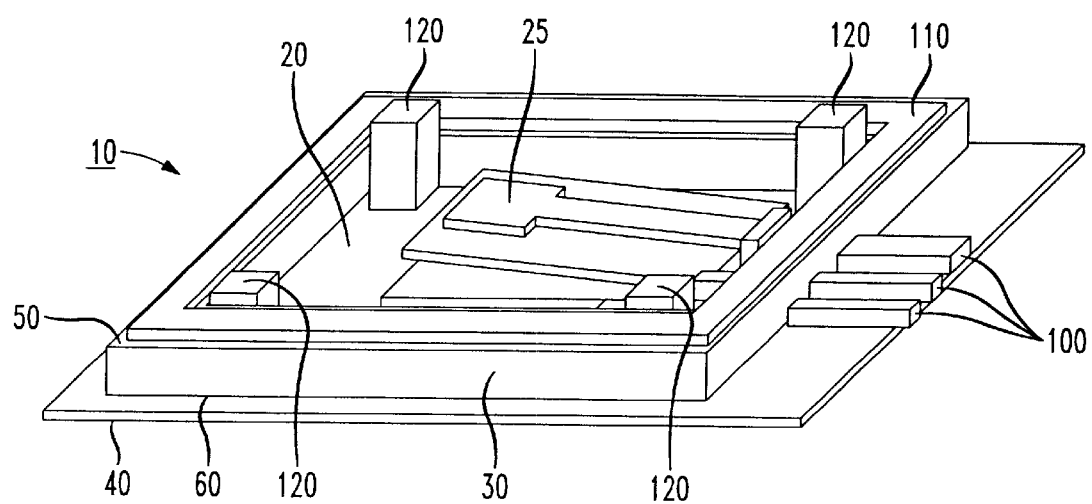
FIG. 3 is a perspective view of a hermetic firewall MEMS package of the invention wherein the firewall includes a ring-shaped solder seal that provides the mechanical support and spacers are provided separately.

FIG. 3 depicts yet another preferred embodiment of the package 10 of the present invention having a hermetic firewall 30. A metal film as described above is evaporated on top 50 of the firewall structure and will form the hermetic seal 80 for the cavity 20. The solder material is deposited on top 50 of firewall 30 to produce a solder seal 110 for cavity 20. When the solder seal 110 is made, it provides both the hermeticity and mechanical strength necessary for the flip-chip bonding process to produce a sturdy, strong hermetic package. Independent spacers 120 may also be provided to accurately define the required gap or spacing between the substrates. Spacers 120 may be fabricated on either or both of substrates 40, 70 and may be placed at arbitrary locations thereon.

Figure 4A:
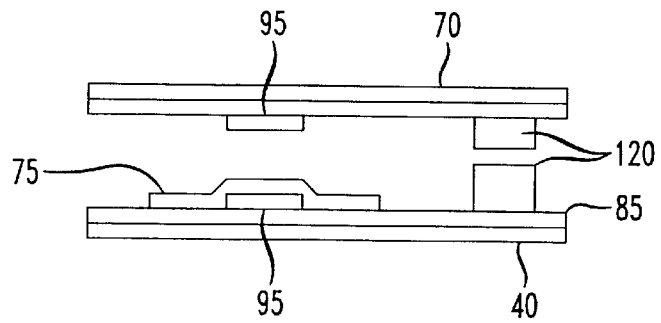
FIGS. 4a–c depict a schematic process of solder bump or ring-shaped solder seal.
Figure 4B:
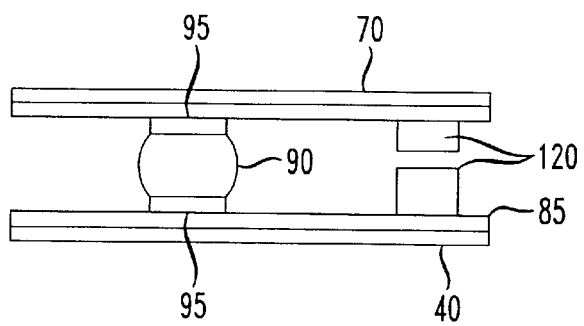
Figure 4C:
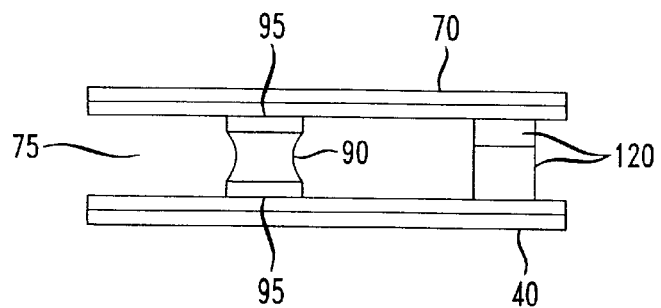

The process of solder bump or ring-shaped solder seal is schematically shown in FIGS. 4a–4c. In all preferred embodiments utilizing solder bump or ring-shaped solder seal bonding, the height of the spacers 120 are intentionally made higher than the solder bumps. For the solder bump preparation, one can deposit solder 75 onto a larger footprint than metal pad, over a dielectric layer 85 that the solder does not wet (FIG. 4a). Upon heating, the surface tension will increase the solder bump 90 height and decrease its footprint (FIG. 4b). This mechanism enables the solder bumps 90 to make contact to the mating metal pad 95 on the other substrate. Upon cooling, the solder shrinks and actively pulls the two substrates together (FIG. 4c). This process guarantees an intimate connection between the spacers, and precise separation between the two substrates.

One disadvantage of the embodiment of FIG. 3 is that if any flux material (either in the gas phase or the liquid phase) is necessary for soldering, the MEMS device 25 will be exposed to this environment. This might not be detrimental to MEMS device 25 if the proper flux is used, but will limit the ability to provide a controlled environment for the MEMS device.

Figure 5:
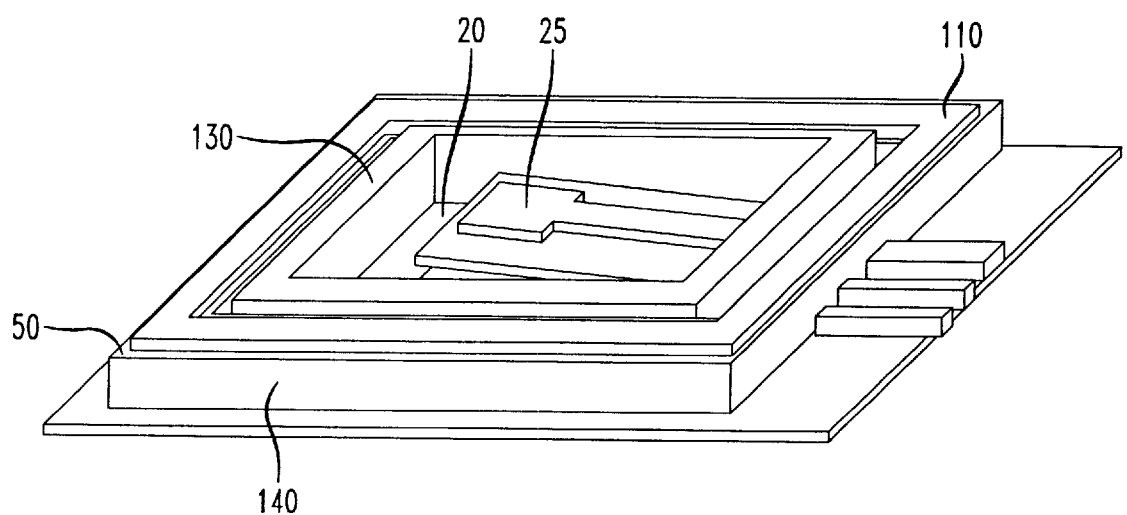
FIG. 5 is an elevated perspective view of a hermetic firewall MEMS package of the invention wherein a double-walled structure is implemented and wherein an inner wall provides the MEMS sealed environment while an outer wall includes a ring-shaped solder seal that provides a second hermetic seal and mechanical support for the package.

FIG. 5 depicts still another preferred embodiment of the package 110 containing a hermetic firewall of the present invention. In this embodiment, a double-walled firewall structure is fabricated on either substrate 40, 70. The inner wall 130 is similar to that of FIG. 1 wherein metal layers 80 are eposited on the top 50 of firewall 30, and provide the appropriate spacing for cavity 20. An outer wall 140 is similar to the firewall 30 of FIG. 3 wherein a layer of solder material 110 is deposited on the top 50 of firewall 30. The mechanical strength for the resulting package is provided by the outer wall 140. In this embodiment, the inner wall 130 is bonded to either substrate 40, 70 with a "tack" bond between two metal layers 80 that is created by applying pressure between the two substrates at a low temperature as compared to the melting temperature of the solder of seal 110. When this process is accomplished in a controlled environment, the space encapsulated by the inner wall 130 maintains this environment and is sealed off. After the low-temperature tack bonding is accomplished, it is possible to simply heat up the substrate 40 or 70 to a temperature sufficient to melt the solder to thereby form the solder bond on outer wall 140. The double-walled firewall of FIG. 4 thus advantageously protects MEMS device 25 from the deleterious effects of the soldering process.

The environment within the cavity defined by the firewall can be controlled by performing the flip-chip bonding process under the desired environment. Such desired environment may include, for example, controlled pressure, controlled humidity, and controlled gas chemistries. The cavity 20 created by this flip-chip bonding process protects the MEMS devices, so that the flip-chip bonded substrates can now be further packaged using conventional packaging techniques that might otherwise be detrimental to the MEMS devices.

While there have been shown and described certain fundamental novel features of the invention as applied to preferred embodiments thereof, it will be understood that various omissions and substitutions and changes in the methods and apparatus described herein, and in their operation, may be made by those skilled in the art without departing from the spirit and scope of the invention. It is expressly intended that all combinations of those elements and/or method steps which perform substantially the same function in substantially the same way to achieve the same result are within the scope of the invention. Substitution of elements from one described embodiment to another are also fully intended and contemplated. It is the intention, therefore, to be limited only as indicated by the scope of the claims appended hereto.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A packing having a cavity with a height for having a micro-electromechanical systems (MEMS) device and sealing the MEMS device in the cavity to protect the MEMS device against deleterious conditions present in an environment of the package, comprising:

a first substrate for defining a base on which the MEMS device is fabricated;

a firewall fabricated on the first substrate and having a bottom surface engaged with the first substrate, said firewall forming walls of the cavity which extend upwardly away from the bottom surface for fully surrounding the MEMS device within the cavity which is bounded and formed by the firewall and the first substrate, said firewall comprising alternating stacks of poly-silicon and silicon dioxide encapsulated by poly-silicon; and a second substrate bonded to the first substrate over the firewall and in sealed engagement with the firewall for creating a cavity-closing seat for the cavity within which the MEMS device is fully enclosed against the deleterious conditions present in the environment of the package so that the MEMS device is packaged protectedly within the cavity and remote from the deleterious conditions.

2. The package of claim 1, wherein the seal is a hermetic seal.

3. The package of claim 2, wherein the hermetic seal comprises a thin film metal material overlaying at least a portion of a top surface of the firewall.

4. The package of claim 3, wherein the hermetic seal comprises a thin film metal material soldered to the top surface of the firewall to produce the hermetic seal having a mechanical strength and imparting structural integrity to the package.

5. The package of claim 4, further comprising a plurality of solder bumps fabricated on the first substrate to supplement the mechanical strength provided by the hermetic seal.

6. The package of claim 5, wherein the thin film metal material comprises gold.

7. The package of claim 5, wherein the thin film metal material comprises silver.

8. The package of claim 5, wherein the thin film metal material comprises an alloy of gold.

9. The package of claim 5, wherein the thin film metal material comprises an alloy of silver.

10. The package of claim 1, further comprising electrical leads connected to the MEMS device in the cavity and extending through the firewall.

11. The package of claim 10, wherein the electrical leads comprise a poly-silicon layer surrounded by a silicon dioxide layer which is further surrounded by another layer of poly-silicon.

12. The package of claim 1, further comprising a plurality of spacers formed on either one or both of the two substrates to space apart the two substrates by a predetermined distance and thereby define a height of the cavity, and wherein the second substrate is placed over the cavity in further sealed engagement with the plurality of spacers.

13. A package having a cavity with a height for housing a micro-electromechanical systems (MEMS) device and sealing the MEMS device in the cavity to protect the MEMS device against deleterious conditions present in an environment of the package, comprising:

a first substrate for defining a base on which the MEMS device is fabricated;

a firewall fabricated on the first substrate and having a bottom surface engaged with the first substrate, said firewall forming walls of the cavity which extend upwardly away from the bottom surface, for fully surrounding the MEMS device within the cavity which is bounded and formed by the firewall and the first substrate;

electrical leads connected to the MEMS device in the cavity and extending through the firewall, said electrical leads comprising a poly-silicon layer surrounded by a silicon dioxide layer which is farther surrounded by another layer of poly-silicon; and a second substrate bonded to the first substrate over the firewall and in sealed engagement with the firewall for creating a cavity-closing seat for the cavity within which the MEMS device is fully enclosed against the deleterious conditions present in the environment of the package so that the MEMS device is packaged protectedly within the cavity and remote from the deleterious conditions.

14. The package of claim 13, further comprising a plurality of spacers formed on either one or both of the two substrates to space apart the two substrates by a predetermined amount and thereby define a height of the cavity, and wherein the second substrate is placed over the cavity in further sealed engagement with the plurality of spacers.

15. The package of claim 13, wherein the seal is a hermetic seal comprising a thin film metal material overlaying at least a portion of a top surface of the firewall.

16. The package of claim 15, wherein the hermetic seal is soldered to the top surface of the firewall to produce the hermetic seal having a mechanical strength and imparting structural integrity to the package.

17. The package of claim 16, further comprising a plurality of solder bumps fabricated on the first substrate to supplement the mechanical strength provided by the hermetic seal.

18. The package of claim 13, wherein the firewall comprises alternating stacks of poly-silicon and silicon dioxide encapsulated by poly-silicon.

* * * * *